United States Patent
Yee et al.

(10) Patent No.: US 7,236,005 B1
(45) Date of Patent: Jun. 26, 2007

(54) MAJORITY VOTER CIRCUIT DESIGN

(75) Inventors: Yibin Yee, Portland, OR (US); James W. Tschanz, Portland, OR (US); Muhammad M. Khellah, Lake Oswege, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 153 days.

(21) Appl. No.: 11/053,788

(22) Filed: Feb. 9, 2005

(51) Int. Cl.
*H03K 19/23* (2006.01)
*H03K 19/003* (2006.01)
*H03K 19/20* (2006.01)

(52) U.S. Cl. .......................... 326/36; 326/11; 326/104

(58) Field of Classification Search .................. 326/11, 326/35–36, 104; 327/215
See application file for complete search history.

(56) References Cited

U.S. PATENT DOCUMENTS

| | | | |
|---|---|---|---|
| 3,320,598 A | 5/1967 | Star | |
| 4,692,640 A * | 9/1987 | Suzuki et al. .................. | 326/11 |
| 4,769,644 A | 9/1988 | Frazier | |
| 5,086,429 A | 2/1992 | Gray et al. | |
| 5,140,594 A * | 8/1992 | Haulin ........................ | 714/797 |
| 5,233,615 A | 8/1993 | Goetz | |
| 5,339,404 A | 8/1994 | Vandling, III | |
| 5,349,654 A | 9/1994 | Bond et al. | |
| 5,384,906 A | 1/1995 | Horst | |
| 5,515,282 A | 5/1996 | Jackson | |
| 5,537,655 A | 7/1996 | Truong | |
| 5,680,408 A | 10/1997 | Tsirkel | |
| 5,838,166 A | 11/1998 | Nakamura | |
| 6,580,296 B1 | 6/2003 | Beiu | |
| 6,910,173 B2 * | 6/2005 | Mitra et al. .................. | 714/760 |
| 2005/0188282 A1* | 8/2005 | Joshi ........................... | 714/43 |
| 2006/0061382 A1* | 3/2006 | Ye et al. ....................... | 326/11 |
| 2006/0184595 A1 | 8/2006 | Tschanz et al. | |
| 2006/0221724 A1 | 10/2006 | Maheshwari et al. | |

OTHER PUBLICATIONS

Nakamura, Kazuyuki, et al., "A 50% Noise Reduction Interface Using Low-Weight Coding", 1996 Symposium on VLSI Circuits, Digest of Technical Papers, pp. 144-145 (Jun. 13-15, 1996).
Stan, Mircea R., et al., "Bus-Invert Coding for Low-Power I/O", IEEE Transactions on Very Large Scale Integration (VLSI) Systems, vol. 3, No. 1, pp. 49-58 (Mar. 1995).

* cited by examiner

*Primary Examiner*—James H. Cho
*Assistant Examiner*—Jason Crawford
(74) *Attorney, Agent, or Firm*—Matthew C. Fagan

(57) ABSTRACT

A method and apparatus for performing majority voting is presented. The method selects pairs of inputs, performs AND and NOR operations on each pair of inputs to determine that each pair of inputs is both high or both low, yielding a quantity of "both high" pairs and a quantity of "both low" pairs, and compares the quantity of "both high" pairs against the quantity of "both low" pairs to determine the majority. The apparatus includes AND gates configured to receive pairs of values and NOR gates configured to receive the same pairs of values, with a connections between all AND gates and connections between all NOR gates. A summation element sums all AND gate outputs and all NOR gate outputs to determine the majority.

20 Claims, 4 Drawing Sheets

MAJORITY VOTER CIRCUIT DESIGN

BACKGROUND OF THE INVENTION

1. Field of the Invention

The present invention relates generally to the field of priority control, and more specifically to determining priority based on voting.

2. Description of the Related Art

In digital computations, multiple input values may be received at a circuit with the requirement to a single resultant value based on the inputs received. The resultant value may be determined in various ways, one such way being the majority of values received, a technique called "voting." For example, a series of 1s and 0s may be received as input, with the resultant value being either 1 or 0 depending on the quantity of each operand received. If more 0s are received than is, the result will be 0, and vice versa. The difficulty is quickly and efficiently determining the resultant value.

Circuits designed to employ majority voting have typically included a counting section and an operation section. The counting section determines the quantity of each available value received as input, such as two 0s, three is, seven 2s, and so forth, while the operation section adds and/or subtracts values received from the counting section. For eight distinct inputs, approximately seven separate circuit elements may be required to assess voting. If additional inputs are received, more circuit elements are typically required. If the number of input values or bits is N, the needed number of circuit elements or logic gates is proportional to $N^2$.

Such circuitry may consume significant amounts of static power, and may require a reference voltage or threshold to form a baseline. The hardware required to generate a reference voltage is frequently complex and consumes significant power.

While voting circuitry is simple, straightforward, and relatively well known, it would be desirable to offer a simple, straightforward mechanism or method that offers reduced complexity and power consumption and may provide for fewer circuits or components than existing designs.

DESCRIPTION OF THE DRAWINGS

The present invention is illustrated by way of example, and not by way of limitation, in the figures of the accompanying drawings in which.

DETAILED DESCRIPTION OF THE INVENTION

Figure 1:
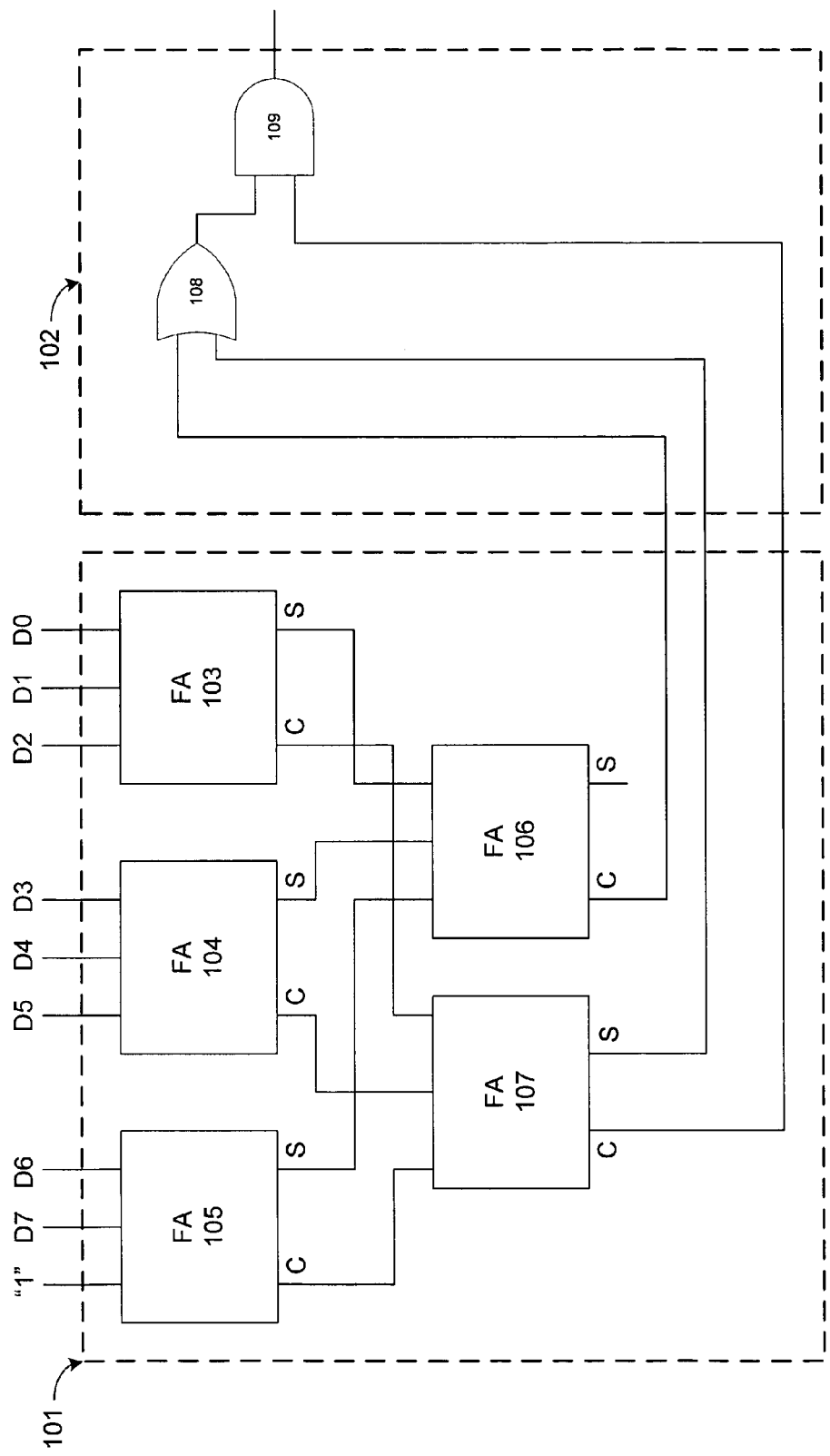
FIG. 1 is a previous implementation of an 8 bit majority voting circuit.

FIG. 1 illustrates a previous 8-bit majority voter digital circuit. From FIG. 1, the first stage of the circuit, or counting stage 101, counts the number of is received as input bits using full adder (FA) circuits. Full adder circuit 103 adds inputs D0, D1, and D2, while full adder circuit 104 adds inputs D3, D4, and D5, and full adder circuit 105 adds inputs D6, D7, and "1," or a value of 1. The result of each full adder circuit is a carry and a sum. The full adder circuits add the received bits according to the truth table shown in Table 1.

TABLE 1

| Input | | | Output | |
|---|---|---|---|---|
| C | A | B | S | C |
| 0 | 0 | 0 | 0 | 0 |
| 1 | 0 | 0 | 1 | 0 |
| 0 | 1 | 0 | 1 | 0 |
| 1 | 1 | 0 | 0 | 1 |
| 0 | 0 | 1 | 1 | 0 |
| 1 | 0 | 1 | 0 | 1 |
| 0 | 1 | 1 | 0 | 1 |
| 1 | 1 | 1 | 1 | 1 |

The values of full adders 103, 104, and 105 feed into full adders 106 and 107, which operate according to Table 1 above. The output of full adders 106 and 107 feed to addition/subtraction element 102, which includes OR gate 108 and AND gate 109 in this configuration. OR gate 108 ORs the Carry value from full adder 106 with the Sum value of full adder 107, and AND gate 109 ANDs the value from OR gate 108 with the Carry value from full adder 107. The result from addition/subtraction element 102 is a four out of eight value, or majority voted value, from AND gate 109.

Figure 2:
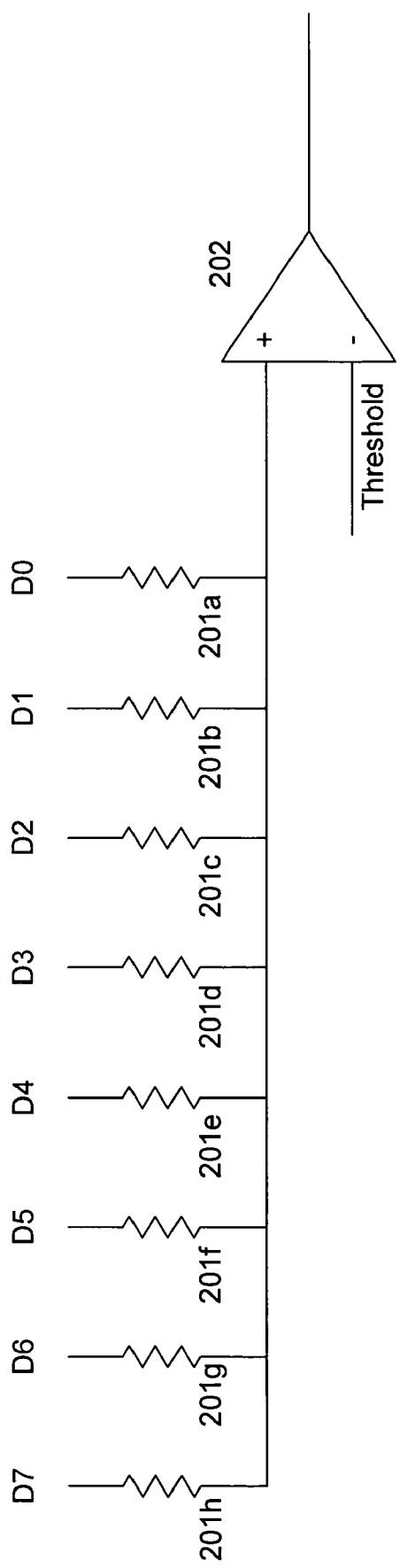
FIG. 2 is an analog 8 bit majority voting circuit operating in a similar manner to the digital design of FIG. 1.

An alternate representation of the eight bit digital majority voter is illustrated in FIG. 2. FIG. 2 is an analog representation of a majority voter, with inputs D0 through D7 and resistors 201a–h summing into amplifier 202 and having a threshold value subtracted. The result is the four out of eight vote similar to that illustrated in FIG. 1. In FIG. 2, all values of current received become voltages, and if the sum of all voltages exceeds a threshold, defined as the 50 percent level of all values being high, the voted value is "1." If the sum of all voltages does not exceed the 50 percent threshold, the voted value is "0." A reference or threshold value is needed to implement the design.

Figure 3:
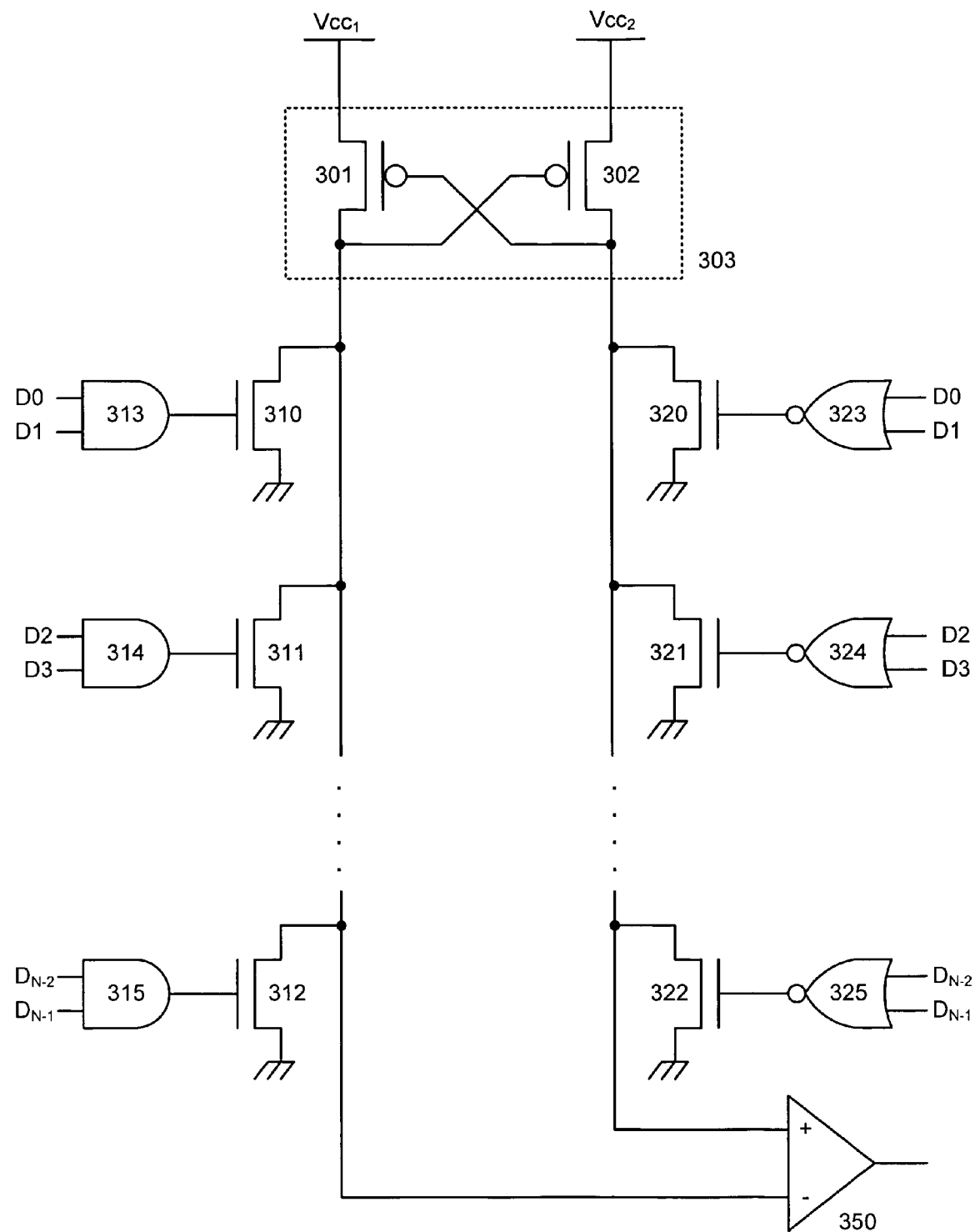
FIG. 3 illustrates an embodiment of an N-bit majority voting circuit according to the present design.

FIG. 3 presents one embodiment of the present design. From FIG. 3, N bit inputs or input values are provided, with N/2 inputs on the right side in the embodiment shown and N/2 inputs on the left side. Switches 301 and 302 form two cross coupled PMOS transistors 303, also called a cross coupling arrangement, each connecting to NMON transistors 310, 311, and 312 in this embodiment, where more such devices may be included, and AND gates 313, 314, and 315, each having two inputs. On the right side, the two cross coupled PMOS transistors 303 connect to NMON transistors 320, 321, and 322, as well as NOR gates 323, 324, and 325, again each having two inputs, where the two inputs are identical to those to the AND gates on the left side of FIG. 3. As reflected by the ellipses in FIG. 3, additional NMON transistors and AND/NOR gates may be provided depending on the number of inputs received. The final element is summation unit 350 that collects the right side signals and subtracts the left side signals to provide a final value.

In operation, for the AND gates, the output is "1" only when both values received are "1." The same two values passed to the NOR gate on the right side produce an output of "1" only when both inputs are "0." The output of each gate connects to a pull down NMON transistor. Thus the number of ON transistors on the left side in the embodiment shown, employing the AND gates, equals the number of groups for which both inputs are "1," and the number of ON transistors on the right on the right the number for which both inputs are "0." For groups of two inputs where one value is "1" and the other "0," neither transistor on the left or right side is ON. The result produced on the left side is the number of "11" groups while the number produced on the right side is the number of "00" groups. Since an "01" or a "10" pairing provide an equal number of "1" and "0" values, the majority can be determined by assessing whether more "11" groups exist than "00" groups. Thus if the number of ON transistors on the left side of the embodiment shown in FIG. 3 exceeds the number of ON transistors on the right side, more "1s" exist. If the number of ON transistors on the right side of the embodiment shown in FIG. 3 exceeds the number of ON transistors on the left side, more "0s" exist.

With the structure of the two cross coupled PMOS transistors 303, the voltage develops due to the different number of ON transistors on the two sides. The voltage difference may be sensed by a regular sense amplifier, shown as summation unit 350 in FIG. 3. No reference voltage is necessary in this embodiment.

Transistors on both sides may be well matched to achieve better results. Longer channel devices may be employed to reduce the mismatch. The implementation may provide a not-insignificant quantity of current flowing from switch 301 and switch 302 to the NMOS transistors presented.

Figure 4:
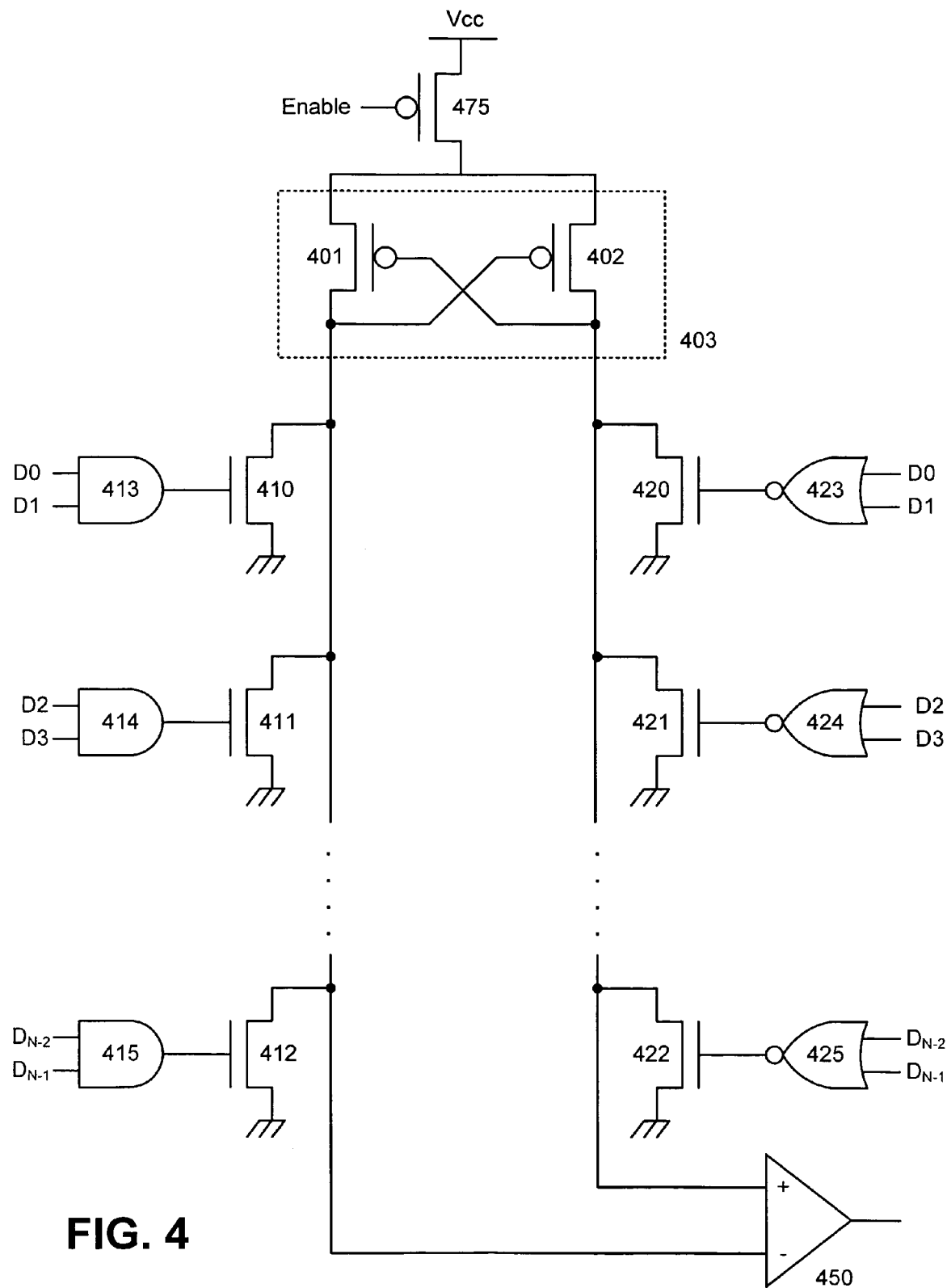
FIG. 4 shows an embodiment of an N-bit majority voting circuit having a single voltage source and employing an enable switch to minimize static current.

Static current can be decreased by adding another PMOS transistor and employing an enabling signal. FIG. 4 illustrates such an implementation. From FIG. 4, switches 401 and 402 form two cross coupled PMOS transistors 403, each connected to enable element 475 and single voltage source Vcc. The two cross coupled PMOS transistors 403 are connected to NMON transistors 410, 411, and 412 and AND gates 413, 414, and 415, each having two inputs. On the right side, the two cross coupled PMOS transistors 403 connect to NMON transistors 420, 421, and 422 and then to NOR gates 423, 424, and 425, again each having two inputs, where the two inputs are identical to those to the AND gates on the left side of FIG. 4. Additional NMON transistors and AND/NOR gates may be provided depending on the number of inputs received. Summation unit 450 collects the right side signals and subtracts the left side signals to provide a final value. This enable signal and single Vcc input allow for enabling the top PMOS transistor 475 before the sense amplifier or summation unit 450 initiates operation, and this architecture permits turning off the top PMOS transistor after disabling the summation unit, reducing the likelihood of static current buildup.

It will be appreciated to those of skill in the art that the present design may be applied to other systems that perform voting, and is not restricted to the arbitration structures and processes described herein. Further, while specific circuits, inputs, and structures have been discussed herein, it is to be understood that more or less or different types of each may be employed while still within the scope of the present invention. Accordingly, any and all modifications, variations, or equivalent arrangements which may occur to those skilled in the art, should be considered to be within the scope of the present invention as defined in the appended claims.

What is claimed is:

1. An apparatus for voting among a plurality of received values, comprising:
   at least one AND gate configured to receive a first plurality of received values;
   at least one NOR gate configured to receive the first plurality of received values;
   a first plurality of connections between all AND gates and a second plurality of connections between all NOR gates; and
   a summation element summing all AND gate outputs and all NOR gate outputs.

2. The apparatus of claim 1, wherein the summing element determines the relative value of the quantity of "11" values received by the at least one AND gate versus the quantity of "00" values determined by the at least one NOR gate.

3. The apparatus of claim 1, wherein said first plurality of connections and said second plurality of connections comprise NMOS transistors.

4. The apparatus of claim 1, further comprising a plurality of cross coupled PMOS transistors coupled to at least one voltage source and to said first plurality of connections and said second plurality of connections.

5. The apparatus of claim 4, wherein the at least one voltage source comprises one voltage source and the plurality of cross coupled PMOS transistors is directly connected to an enabling circuit and the enabling circuit is connected to the one voltage source.

6. The apparatus of claim 1, wherein the voltage across said first plurality of connections exceeding the voltage across said second plurality of connections indicates more "1" values exist than "0" values, resulting in a majority vote of "1."

7. The apparatus of claim 1, wherein the voltage across said second plurality of connections exceeding the voltage across said first plurality of connections indicates more "0" values exist than "1" values, resulting in a majority vote of "0."

8. A majority voting circuit, comprising:
   at least one voltage source;
   a cross coupling arrangement connected to said at least one voltage source;
   a plurality of circuits comprising gates configured to receive pairs of input values and determine whether each pair of inputs is both high or each pair of inputs is both low;
   interconnections between said cross coupling transistor arrangement and said plurality of circuits; and
   a summation element configured to receive voltages from said interconnections and determine whether more dual high pairs exist than dual low pairs.

9. The circuit of claim 8, wherein the plurality of circuits comprise a plurality of AND gates and a corresponding quantity of NOR gates.

10. The circuit of claim 9, wherein the summing element determines the relative value of the quantity of "11" values received by the plurality of AND gates versus the quantity of "00" values determined by the plurality of NOR gates.

11. The circuit of claim 9, wherein said interconnections comprise NMOS transistors connected to each AND gate and to each NOR gate.

12. The circuit of claim 8, wherein the cross coupling arrangement comprises a plurality of cross coupled PMOS transistors.

13. The circuit of claim 8, wherein the at least one voltage source comprises one voltage source and the cross coupling arrangement is directly connected to an enabling circuit and the enabling circuit is connected to the one voltage source.

14. A method of voting to determine a majority of values from a plurality of inputs, comprising:
   selecting pairs of inputs;
   performing AND and NOR operations on each pair of inputs to determine that each pair of inputs is both high or both low, yielding a quantity of "both high" pairs and a quantity of "both low" pairs; and comparing the quantity of "both high" pairs against the quantity of "both low" pairs to determine the majority.

15. The method of claim 14, wherein more pairs of high values than low values indicates the majority is high.

16. The method of claim 14, wherein more pairs of low values than pairs of high values indicates the majority is low.

17. The method of claim 14, wherein all AND operations are performed in parallel and all NOR operations are performed in parallel.

18. The method of claim 14, wherein said performing comprises summing the result of all AND operations and summing the result of all NOR operations.

19. The method of claim 14, further comprising enabling said selecting, performing, and comparing when desired.

20. The method of claim 14, further comprising providing a voltage source and a cross coupling arrangement connecting the voltage source to circuits performing the AND and NOR operations.

* * * * *